*US010541509B2*

United States Patent
Kawanishi et al.

(10) Patent No.: US 10,541,509 B2
(45) Date of Patent: Jan. 21, 2020

(54) SEMICONDUCTOR LIGHT EMITTING DEVICE

(71) Applicant: SONY CORPORATION, Tokyo (JP)

(72) Inventors: Hidekazu Kawanishi, Miyagi (JP); Masahiro Murayama, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/069,601

(22) PCT Filed: Dec. 15, 2016

(86) PCT No.: PCT/JP2016/087435
§ 371 (c)(1),
(2) Date: Jul. 12, 2018

(87) PCT Pub. No.: WO2017/130596
PCT Pub. Date: Aug. 3, 2017

(65) Prior Publication Data
US 2019/0020174 A1 Jan. 17, 2019

(30) Foreign Application Priority Data
Jan. 28, 2016 (JP) .................. 2016-014610

(51) Int. Cl.
*H01S 5/50* (2006.01)
*H01S 5/022* (2006.01)
(Continued)

(52) U.S. Cl.
CPC .............. *H01S 5/022* (2013.01); *H01L 33/36* (2013.01); *H01L 33/50* (2013.01); *H01L 33/507* (2013.01);
(Continued)

(58) Field of Classification Search
CPC ..... H01L 33/507; H01L 33/505; H01L 33/52; H01S 5/02296; H01S 5/02216; H01S 5/02212; H01S 5/02415
See application file for complete search history.

(56) References Cited

U.S. PATENT DOCUMENTS 8,212,467 B2 * 7/2012 Sawamura ............ H01L 33/483
313/498
2001/0048705 A1 12/2001 Kitaoka et al.
(Continued)

FOREIGN PATENT DOCUMENTS

CA 2718903 A 9/2009
CN 101971441 A 2/2011
(Continued)

OTHER PUBLICATIONS

International Search Report and Written Opinion of PCT Application No. PCT/JP2016/087435, dated Mar. 14, 2017, 10 pages of ISRWO.

*Primary Examiner* — Michael Carter
(74) *Attorney, Agent, or Firm* — Chip Law Group

(57) ABSTRACT

A semiconductor light emitting device includes a substrate a semiconductor light emitting element that is disposed on the substrate and that emits light along a direction substantially parallel to a main surface of the substrate a wavelength conversion element that is disposed on a light emitting side of the semiconductor light emitting element, that absorbs a portion of the light emitted from the semiconductor light emitting element, and that emits light having a wavelength different from that of the absorbed light; and a holding member that is disposed on the substrate and holds the wavelength conversion element.

18 Claims, 8 Drawing Sheets

(51) Int. Cl.
*H01L 33/50* (2010.01)
*H01L 33/36* (2010.01)
*H01L 33/64* (2010.01)
*H01S 5/06* (2006.01)

(52) U.S. Cl.
CPC ............ H01L 33/64 (2013.01); H01S 5/0609 (2013.01); H01S 5/02288 (2013.01)

(56) References Cited

U.S. PATENT DOCUMENTS

| | | |
|---|---|---|
| 2001/0050932 A1 | 12/2001 | Sonoda et al. |
| 2001/0053167 A1 | 12/2001 | Kitaoka et al. |
| 2002/0025096 A1* | 2/2002 | Wang .................. G02B 27/09 385/8 |
| 2002/0159489 A1* | 10/2002 | Wolak .................. G02B 6/4203 372/36 |
| 2003/0103534 A1* | 6/2003 | Braiman .............. H01S 5/4006 372/10 |
| 2003/0193720 A1* | 10/2003 | Beach .................... G02B 3/005 359/623 |
| 2004/0067016 A1* | 4/2004 | Anikitchev .......... G02B 6/4206 385/34 |
| 2004/0095969 A1* | 5/2004 | Kaji .................. H01S 3/094003 372/6 |
| 2004/0240498 A1* | 12/2004 | Akamatsu ........... H01S 5/02212 372/36 |
| 2004/0252743 A1* | 12/2004 | Anikitchev ............ G02B 27/09 372/97 |
| 2005/0063428 A1* | 3/2005 | Anikitchev ........ G02B 27/0955 372/9 |
| 2009/0015138 A1* | 1/2009 | Daicho .............. C09K 11/7734 313/503 |
| 2011/0026548 A1 | 2/2011 | Tamaya et al. |
| 2013/0001627 A1 | 1/2013 | Kinoshita et al. |
| 2014/0226689 A1* | 8/2014 | Takeda ................ H01S 5/02296 372/43.01 |
| 2016/0131314 A1* | 5/2016 | Waragaya ............... H01S 5/005 362/538 |

FOREIGN PATENT DOCUMENTS

| | | |
|---|---|---|
| CN | 102804432 A | 11/2012 |
| EP | 1130717 A2 | 9/2001 |
| EP | 2259391 A1 | 12/2010 |
| EP | 2562833 A1 | 2/2013 |
| JP | 11-289131 A | 10/1999 |
| JP | 2002-55370 A | 2/2002 |
| JP | 2002-204025 A | 7/2002 |
| JP | 2003-156774 A | 5/2003 |
| JP | 2004-7023 A | 1/2004 |
| JP | 2010-199357 A | 9/2010 |
| JP | 2011-243951 A | 12/2011 |
| KR | 10-2010-0109981 A | 10/2010 |
| KR | 10-2012-0125376 A | 11/2012 |
| WO | 2009/116134 A1 | 9/2009 |
| WO | 2011/132599 A1 | 10/2011 |

* cited by examiner

[ FIG. 1 ]
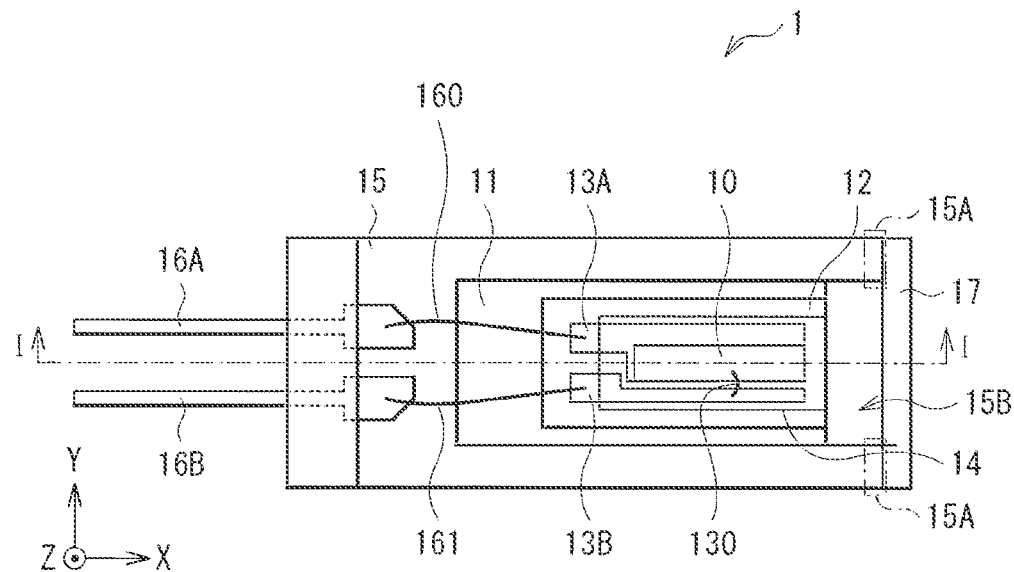
[ FIG. 2 ]
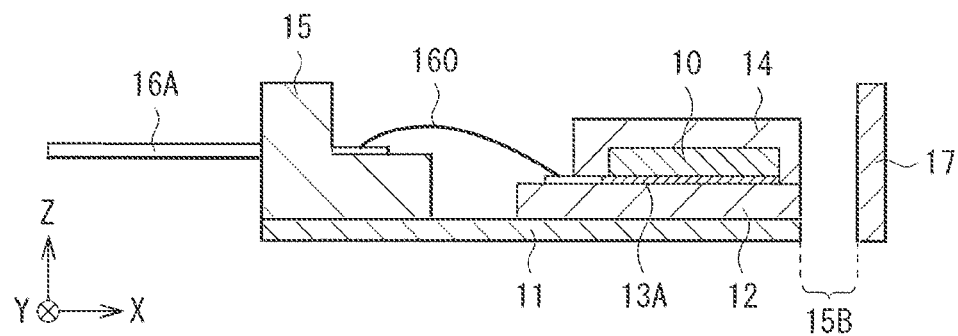
[ FIG. 3 ]
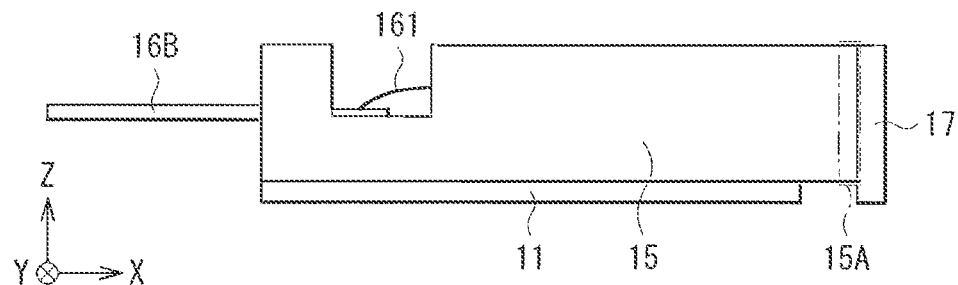

[ FIG. 4 ]
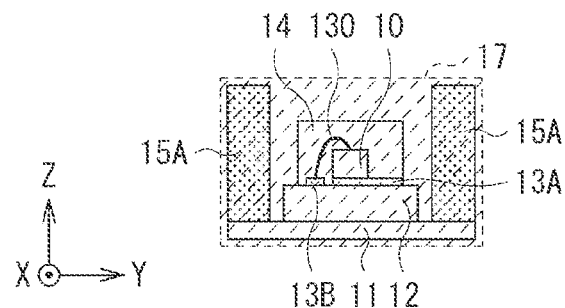
[ FIG. 5 ]
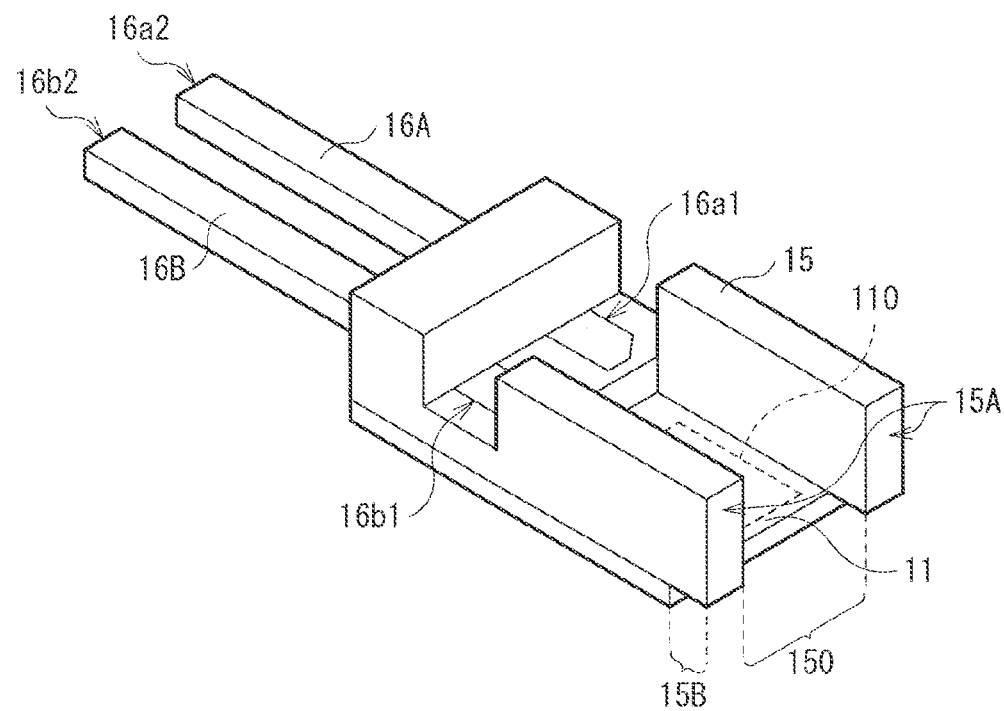

[ FIG. 6 ]
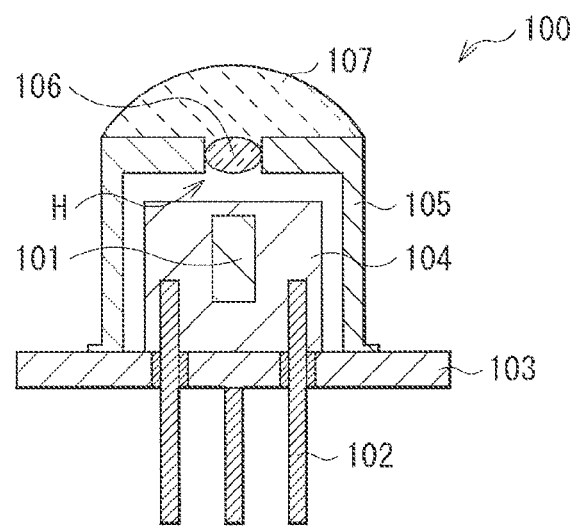

[ FIG. 7 ]
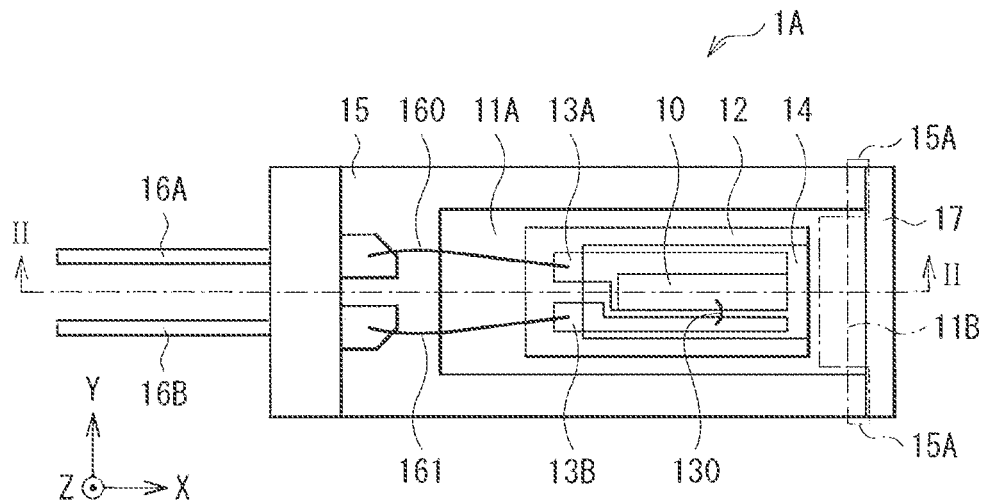
[ FIG. 8 ]
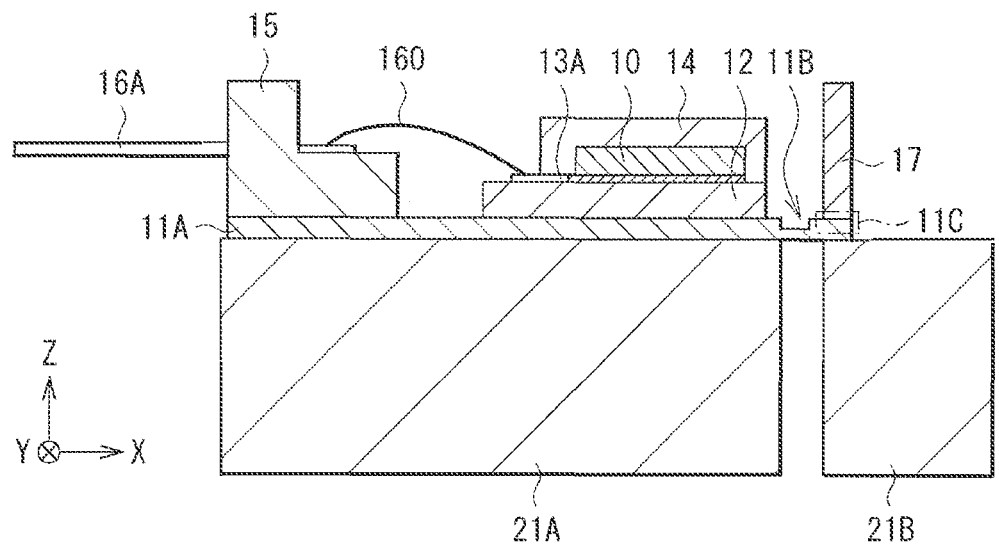
[ FIG. 9 ]
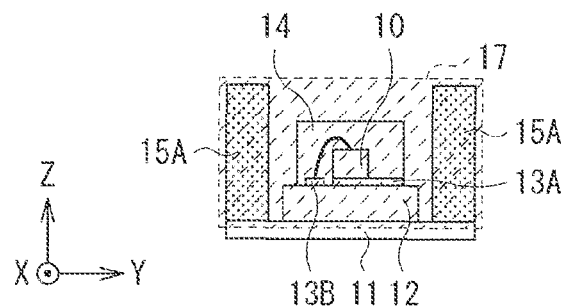

[ FIG. 10A ]
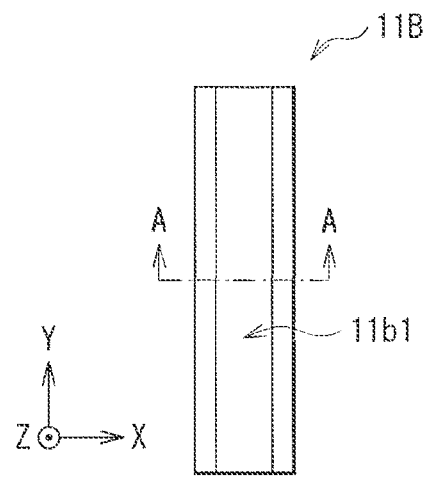
[ FIG. 10B ]
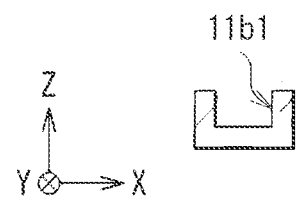
[ FIG. 11 ]
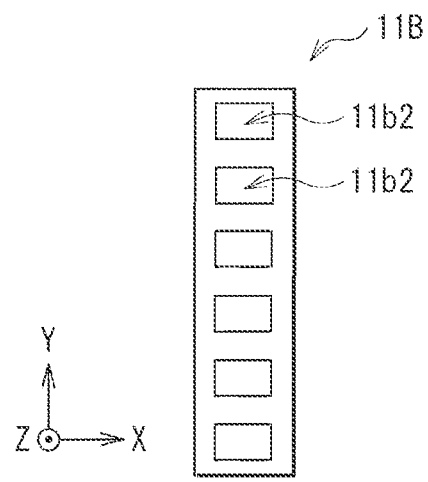

[FIG. 12]
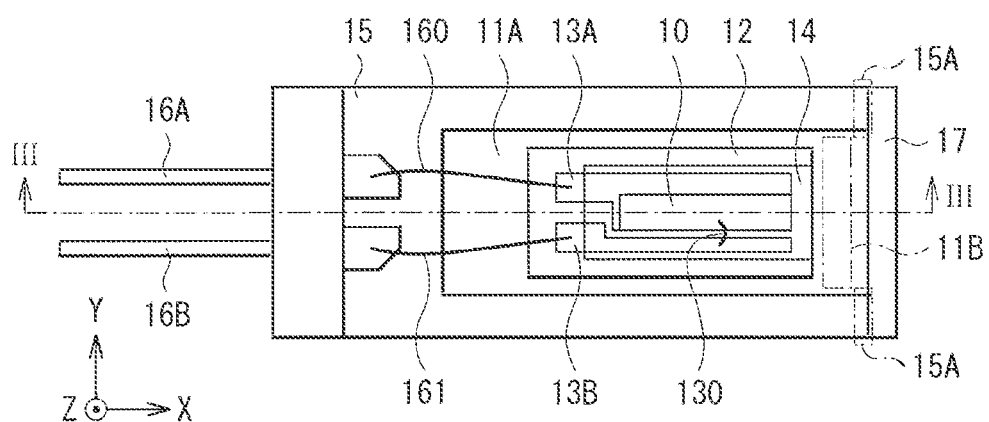
[FIG. 13]
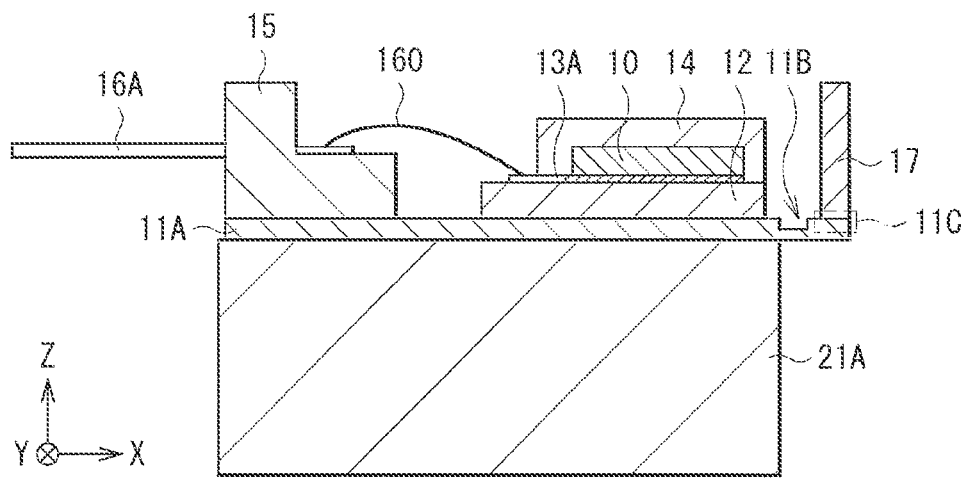

[ FIG. 14 ]
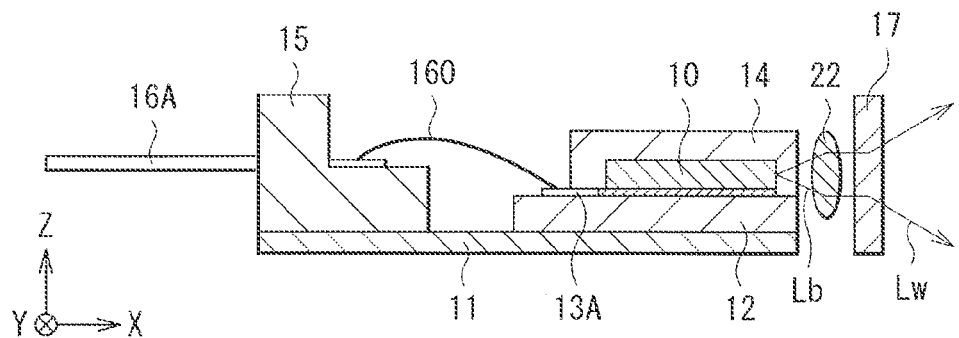
[ FIG. 15 ]
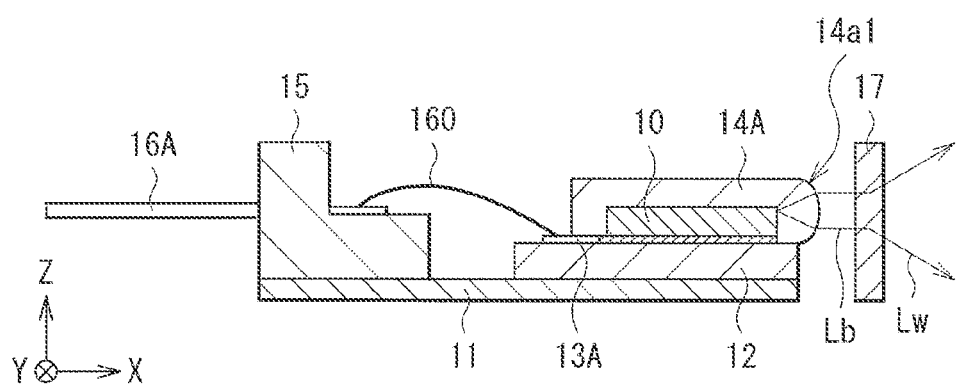
[ FIG. 16 ]
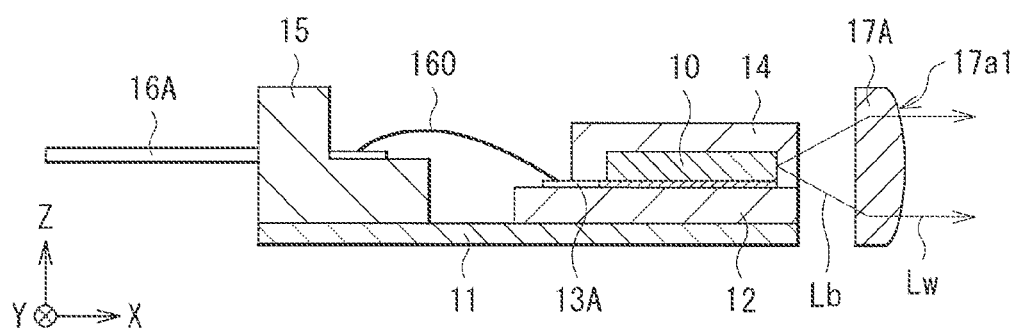

[ FIG. 17 ]
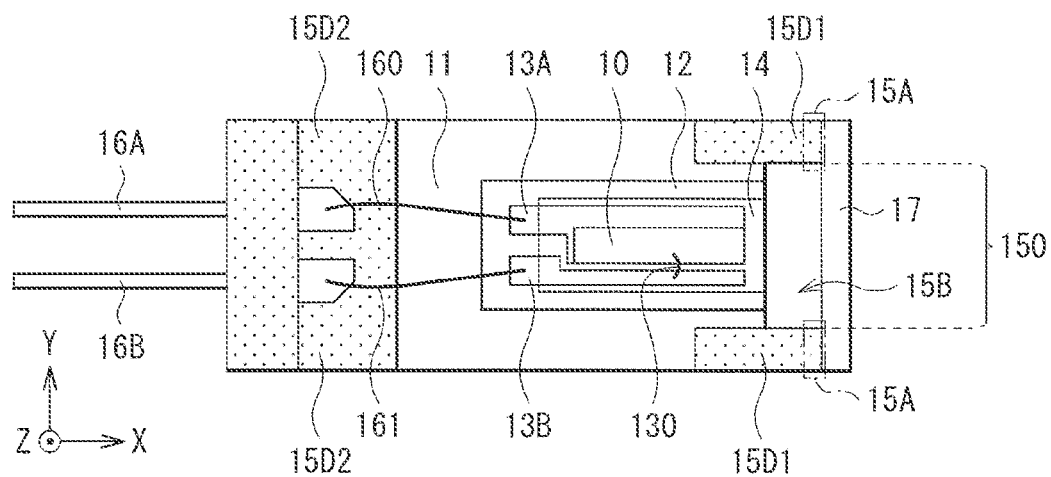

SEMICONDUCTOR LIGHT EMITTING DEVICE

CROSS REFERENCE TO RELATED APPLICATIONS

This application is a U.S. National Phase of International Patent Application No. PCT/JP2016/087435 filed on Dec. 15, 2016, which claims priority benefit of Japanese Patent Application No. JP 2016-014610 filed in the Japan Patent Office on Jan. 28, 2016. Each of the above-referenced applications is hereby incorporated herein by reference in its entirety.

TECHNICAL FIELD

The disclosure relates to a semiconductor light emitting device used for, for example, a semiconductor package.

BACKGROUND ART

Recently, various approaches have been proposed to form a white light source by combining a semiconductor light emitting element such as a blue semiconductor laser (Laser Diode; LD) or a blue light emitting diode (Light Emitting Diode; LED) with phosphor (for example, PTL 1).

CITATION LIST

Patent Literature

PTL 1: Japanese Unexamined Patent Application Publication No. 2010-199357

SUMMARY OF THE INVENTION

Above-mentioned PTL 1 describes a so-called Can-type semiconductor package including phosphor (wavelength conversion element) disposed in a cap that seals a semiconductor laser. Disposed on a light emitting side of the wavelength conversion element is a lens for beam forming.

However, it is difficult to reduce the size of the semiconductor package described in PTL 1.

It is desirable to provide a semiconductor light emitting device allowing for achieving size reduction of the whole device.

A semiconductor light emitting device according to an embodiment of the disclosure includes: a substrate; a semiconductor light emitting element that is disposed on the substrate and that emits light along a direction substantially parallel to a main surface of the substrate; a wavelength conversion element that is disposed on light emitting side of the semiconductor light emitting element, that absorbs a portion of the light emitted from the semiconductor light emitting element, and that emits light having a wavelength different from that of the absorbed light; and a holding member that is disposed on the substrate and holds the wavelength conversion element.

In the semiconductor light emitting device according to the embodiment of the disclosure, the semiconductor light emitting element that emits the light along the direction substantially parallel to the main surface of the substrate and the holding member that holds the wavelength conversion element are provided on the substrate. In a case of the so-called Can-type semiconductor light emitting device, semiconductor light emitting elements are mounted on a columnar base, each of which is sealed by a cylindrical cap. The cap has an opening on its top, and the wavelength conversion element is held in the opening. To the contrary, by disposing the semiconductor light emitting element and the holding member on the substrate and holding the wavelength conversion element by the holding member, size reduction of a part or space saving can be achieved, compared with the Can-type device.

According to the semiconductor light emitting device of the embodiment of the disclosure, size reduction of the part or space saving can be achieved by disposing the semiconductor light emitting element that emits the light along the direction substantially parallel to the main surface of the substrate and the holding member that holds the wavelength conversion element on the substrate. This allows for achieving size reduction of the whole device.

It is to be noted that the above description is merely an example of the disclosure. Effects of the disclosure are not necessarily limited to the effects described above, and may be or may further include other effects.

BRIEF DESCRIPTION OF DRAWING

FIG. 1 is a diagram that illustrates a configuration of a semiconductor light emitting device according to a first embodiment of the disclosure as seen from a top side.

FIG. 2 is a cross-sectional view of the semiconductor light emitting device illustrated in FIG. 1 taken along I-I line.

FIG. 3 is a diagram that illustrates a configuration of a side surface of the semiconductor light emitting device illustrated in FIG. 1.

FIG. 4 is a diagram that illustrates a configuration of another side surface (surface of the light emitting side) of the semiconductor light emitting device illustrated in FIG. 1.

FIG. 5 is a perspective view of a configuration of a substrate, a holding member, and electrodes illustrated in FIG. 1.

FIG. 6 is a cross-sectional view of a configuration of the semiconductor light emitting device according to a comparative example.

FIG. 7 is a diagram that illustrates a configuration of a semiconductor light emitting device according to a second embodiment of the disclosure as seen from a top side.

FIG. 8 is a cross-sectional view of the semiconductor light emitting device illustrated in FIG. 7 taken along II-II line.

FIG. 9 is a diagram that illustrates a configuration of a side surface (surface of the light emitting side) of the semiconductor light emitting device illustrated in FIG. 7.

FIG. 10A is a schematic plan view for describing an example of a heat insulation structure illustrated in FIG. 7.

FIG. 10B is a cross-sectional view taken along A-A line illustrated in FIG. 10A.

FIG. 11 is a schematic plan view for describing another example of the heat insulation structure illustrated in FIG. 7.

FIG. 12 is a diagram that illustrates a configuration of a semiconductor light emitting device according to a first modification example as seen from a top side.

FIG. 13 is a cross-sectional view of the semiconductor light emitting device illustrated in FIG. 12 taken along line.

FIG. 14 is a cross-sectional view of a main part configuration of a semiconductor light emitting device according to a second modification example.

FIG. 15 is a cross-sectional view of a main part configuration of a semiconductor light emitting device according to a third modification example.

FIG. 16 is a cross-sectional view of a main part configuration of a semiconductor light emitting device according to a fourth modification example.

FIG. 17 is a cross-sectional view of a main part configuration of a semiconductor light emitting device according to a fifth modification example.

MODES FOR CARRYING OUT THE INVENTION

In the following, some embodiments of the disclosure are described in detail with reference to the drawings. It is to be noted that description is made in the following order.
1. First Embodiment (an example of a semiconductor light emitting device in which a semiconductor light emitting element and a frame-like holding member are provided on a substrate, and a wavelength conversion element is held by the holding member with the substrate and a gap being provided therebetween)
2. Second Embodiment (an example of the semiconductor light emitting device in which the substrate is coupled to the wavelength conversion element and which has a heat insulation structure)
3. First Modification Example (another example in which the substrate is coupled to the wavelength conversion element)
4. Second Modification Example (an example in which a lens is disposed between the semiconductor light emitting element and the wavelength conversion element)
5. Third Modification Example (an example in which a sealing member of the semiconductor light emitting element has a lens shape)
6. Fourth Modification Example (an example in which a base material of the wavelength conversion element has a lens shape)
7. Fifth Modification Example (an example in which the holding member has another shape)

First Embodiment

Configuration

FIG. 1 illustrates a configuration of a semiconductor light emitting device (semiconductor light emitting device 1) according to a first embodiment of the disclosure as seen from the top side (XY plane configuration). FIG. 2 illustrates a cross-sectional configuration taken along I-I line in FIG. 1 (XZ cross-sectional configuration). FIG. 3 illustrates a configuration of a side surface of the semiconductor light emitting device 1. FIG. 4 illustrates a configuration of another side surface (a surface on the light emitting side) of the semiconductor light emitting device 1. The semiconductor light emitting device 1 is a so-called lead-frame integrated semiconductor package.

The semiconductor light emitting device 1 includes, on a substrate 11, for example, a semiconductor light emitting element 10 that emits light along a direction substantially parallel to a main surface of the substrate 11. Disposed on the substrate 11 is a holding member 15 at least in a portion of a periphery of the semiconductor light emitting element 10 (to surround at least a portion of the semiconductor light emitting element 10). A wavelength conversion element 17 is disposed on the light emitting side of the semiconductor light emitting element 10, and the wavelength conversion element 17 is held by the holding member 15.

A sealing member 14 is formed on the substrate 11 to cover the semiconductor light emitting element 10. Disposed between the substrate 11 and the semiconductor light emitting element 10 is, for example, a submount 12 (the semiconductor light emitting element 10 is mounted on the substrate 11 via the submount 12). Disposed on the submount 12 are a first electrode 13A electrically coupled to one electrode of the semiconductor light emitting element 10 and a second electrode 13B electrically coupled to the other electrode of the semiconductor light emitting element 10. The first electrode 13A and the second electrode 13B are electrically coupled to a first electrode 16A and a second electrode 16B via wires 160 and 161, respectively. In the following, specific configurations of the parts are described.

The substrate 11 includes, for example, metal having a high rate of thermal conductivity, and specifically copper (Cu), aluminum (Al), or the like, and configures a so-called lead-frame bottom plate. A surface shape of the substrate 11 (shape of XY plane) is rectangular, for example. It is to be noted, however, that the surface shape is not limited to rectangular but may be of any other shape and may have a notched portion or a portion projecting to the outside.

The submount 12 includes aluminum nitride (AlN), for example. The submount 12 is provided for purpose of relaxing stress due to a difference in coefficient of thermal expansion between the semiconductor light emitting element 10 and the substrate 11, or of retaining mechanical strength. The submount 12 may be provided as needed and may not necessarily be provided.

The semiconductor light emitting element 10 is, for example, a light emitting element that emits blue light, and includes either of light emitting elements such as a semiconductor laser (LD), an end-face-emitting type light emitting diode (LED), and a superluminescent diode (SLD: Superluminescent diode). For example, for the semiconductor light emitting element 10, a light emitting element (LD, SLD) is preferably used in which radiation angles of emitted light are different in a direction parallel to the substrate 11 and in a direction perpendicular to the substrate 11. One example may be an end-face-emitting type semiconductor laser. The semiconductor light emitting element 10 emits light along a direction substantially parallel to the main surface of the substrate 11 or the XY plane (X direction in this example), as described above. In other words, it is disposed so that the light is emitted from the side surface of the semiconductor light emitting device 1. In this case, the semiconductor light emitting element 10 is disposed so that the light is emitted from the side surface corresponding to one short side among the sides of the rectangular substrate 11 (the light emitting face of the semiconductor light emitting element 10 faces the side surface corresponding to the short side). It is to be noted that "substantially" parallel means that a large portion of a light flux emitted from the semiconductor light emitting element 10 runs along a direction parallel to the main surface of the substrate 11. In other words, it means that the large portion of the light flux emitted from the semiconductor light emitting element 10 is extracted from the side surface of the semiconductor light emitting device 1, and a portion of the emitted light may be non-parallel to the main surface of the substrate 11.

The semiconductor light emitting element 10 that emits blue light may include, for example, a Group III-V nitride semiconductor such as gallium nitride (GaN). Other examples of the Group III-V nitride semiconductor may include AlGaN, InGaN, and AlInGaN. Another element may be further included such as boron (B), thallium (Tl), arsenic (As), phosphorus (P), or antimony (Sb). Such a Group III-V nitride semiconductor may be doped with an n-type impurity of a Group IV or VI element such as silicon (Si), germanium (Ge), oxygen (O), or selenium (Se), or a p-type impurity of a Group II or IV element such as magnesium (Mg), zinc (Zn), or carbon (C), as necessary.

The semiconductor light emitting element 10 includes a pair of electrodes (anode and cathode) to apply a voltage to an active layer that includes the nitride semiconductor as described above. Among these electrodes, for example, the cathode is formed on the bottom side (on the side of the submount 12) and electrically coupled to the first electrode 13A. On the other hand, the anode is formed on the top side and electrically coupled to the second electrode 13B via a wire 130 (by wire bonding).

Each of the first electrode 13A and the second electrode 13B includes a laminated film of, for example, titanium (Ti), platinum (Pt), and gold (Au), and is formed on the submount 12 in a predetermined pattern. The first electrode 13A is electrically coupled to the first electrode 16A via the wire 160 (by wire bonding). The second electrode 13B is electrically coupled to the second electrode 16B via the wire 161 (by wire bonding).

The sealing member 14 is provided to airtightly seal the semiconductor light emitting element 10. The sealing member 14 is formed on the submount 12 to have a rectangular solid shape, for example, so as to cover all over the side surface and the top surface of the semiconductor light emitting element 10. The sealing member 14 includes, for example, glass or resin having translucency. Here, with the blue semiconductor laser, if not airtightly sealed, silicone polymer in the working atmosphere may be absorbed by an end outputting a laser having high light density. Providing the sealing member 14 as described in the embodiment makes it possible to airtightly seal the semiconductor light emitting element 10, suppress such an influence by the silicone polymer as described above, and thus maintain reliability of the laser. It is to be noted, however, that the sealing member 14 may not be provided as long as it is possible to airtightly seal the semiconductor light emitting element 10 using any other means. It is also to be noted that the sealing member 14 may not be provided in a case where absorption of the silicone polymer is suppressed by any technical devise.

The holding member 15 is a member that retains the wavelength conversion element 17 to be disposed to face the light emitting face of the semiconductor light emitting element 10. The holding member 15 desirably includes, for example, a material having thermal conductivity lower than that of the substrate 11 (metal or nonmetal). One such example is a nonmetal such as resin and ceramics. In this embodiment, the holding member 15 is provided in a shape of a frame surrounding the semiconductor light emitting element 10 and has an opening (opening 150 to be described later) facing the light emitting face of the semiconductor light emitting element 10.

FIG. 5 illustrates an example of a configuration of the holding member 15 along with configurations of the substrate 11, the first electrode 16A, and the second electrode 16B. A region 110 indicates a region where the semiconductor light emitting element 10 is mounted. Thus, the holding member 15 is a frame-like (frame-shaped) structure disposed along a periphery of the substrate 11, for example, and has the opening 150 in the region facing the light emitting face of the semiconductor light emitting element 10. In other words, the surface shape of the holding member 15 (shape of XY plane) has a shape of capital U (U-shaped). It is to be noted, however, that the holding member 15 may not necessarily be formed in a frame shape. The holding member 15 has only to be configured to hold the wavelength conversion element 17 in a predetermined position, and a portion of the frame may be notched or the holding member 15 may be provided only in a selected region (to be described later).

The first electrode 16A and the second electrode 16B are disposed, for example, to penetrate a portion of the holding member 15 and to project to the outside toward a direction opposite to the light emitting direction of the semiconductor light emitting element 10. One end 16a1 of the first electrode 16A is disposed to be exposed inside the holding member 15 and is coupled to the first electrode 13A via the wire 160. The other end 16a2 of the first electrode 16A serves as a terminal for external coupling. One end 16b1 of the second electrode 16B is disposed to be exposed inside the holding member 15 and is coupled to the second electrode 13B via the wire 161. The other end 16b2 of the second electrode 16B serves as a terminal for external coupling. In this manner, the first electrode 16A and the second electrode 16B are fixed with portions thereof each being embedded (inserted) in the holding member 15 to thereby constitute a portion of the lead frame.

Such a holding member 15 as described above has on the edge of its opening 150 a coupling part 15A for the wavelength conversion element 17 (the wavelength conversion element 17 is coupled to the edge of the opening 150 of the holding member 15). The coupling part 15A may be adhered to the wavelength conversion element 17 via an adhesive or may be engaged with the wavelength conversion element 17 by mechanical fitting, though not illustrated in the figures.

In this embodiment, the coupling part 15A is disposed to project farther outward than the edge of the substrate 11. This configuration allows the region between the wavelength conversion element 17 and the substrate 11 to serve as a gap 15B. That is, in this embodiment, the wavelength conversion element 17 is structured so as to be coupled only to the holding member 15 and not to be in direct contact with the substrate 11.

The wavelength conversion element 17 absorbs a portion of light emitted from the semiconductor light emitting element 10, emits light having a wavelength different from that of the absorbed light, and includes phosphor. For example, in a case where the semiconductor light emitting element 10 emits blue light, the wavelength conversion element 17 includes phosphor that absorbs blue light and (using the blue light as excitation light) emits yellow light. Examples of such phosphor that emits yellow light include YAG doped with cerium (Ce) ($Y_3Al_5O_{12}$:Ce) and α (alpha)-SiAlON doped with europium (Eu) (CaSiAlON:Eu). The wavelength conversion element 17 may otherwise include phosphor that absorbs blue light and emits red light and green light. Examples of such phosphor that emits green light include β (beta)-SiAlON doped with europium ($Si_{(6-X)}Al_XO_XN_{(8-X)}$:Eu) and CSSO doped with cerium ($Ca_3Sc_2Si_3O_{12}$:Ce). Examples of such phosphor that emits red light include $CaAlSiN_3$ doped with europium ($CaAlSiN_3$:Eu).

Workings and Effects

In the semiconductor light emitting device 1, when a predetermined voltage is applied to the cathode and the anode of the semiconductor light emitting element 10 via the first electrodes 16A and 13A and the second electrodes 16B and 13B, a current is injected into the active layer to generate light emission. The light based on the light emission (e.g. blue light) is emitted from an end face of the semiconductor light emitting element 10 in the direction substantially parallel to the main surface of the substrate 11 and enters the wavelength conversion element 17. A portion of the blue light that enters the wavelength conversion element 17 is converted into the light having a different wavelength (e.g., yellow light, or red light and green light). This alters the light outputted from the wavelength conversion element 17 to white light owing to color mixture of, for example, blue light and yellow light (or color mixture of blue light and red light and green light).

Here, FIG. 6 illustrates a cross-sectional configuration of a semiconductor light emitting device (semiconductor light emitting device 100) according to a comparative example of the embodiment. The semiconductor light emitting device 100 is a so-called Can-type semiconductor package in which, for example, a disk-shaped substrate 103 and a columnar member 104 disposed on the substrate 103 configure a base, and an electrode 102 serving as a terminal for external coupling is fixed to the base. A semiconductor light emitting element 101 is mounted on a side surface of the columnar member 104. Further disposed on the substrate 103 is a cylindrical cap 105 to cover the columnar member 104 and the semiconductor light emitting element 101. The cap 105 has an opening H in a portion of its top surface, and a wavelength conversion element 106 is held in the opening H. A lens 107 is formed on the light emitting side of the wavelength conversion element 106 for beam forming. The semiconductor light emitting device 100 according to the comparative example has a large diameter of 3.8 mm or larger, for example, which brings difficulty in size reduction.

To the contrary, the semiconductor light emitting device 1 according to the embodiment includes the semiconductor light emitting element 10 that emits light along the direction substantially parallel to the main surface of the substrate 11 and the frame-like holding member 15 that holds the wavelength conversion element 17, both disposed on the substrate 11. In this manner, by holding the wavelength conversion element 17 using the frame-shaped semiconductor package including the semiconductor light emitting element 10 and the holding member 15 provided on a single substrate 11, size reduction of a part or space saving can be achieved, compared with the Can-type semiconductor package. Moreover, thickness in the direction perpendicular to the substrate 11 can be reduced, which leads to a low-profile configuration. In addition, it is easier to reduce cost using the frame shape.

Moreover, in this embodiment, the holding member 15 includes the material having thermal conductivity lower than that of the substrate 11. For example, the substrate 11 includes a metal, and the holding member 15 includes a nonmetal. Here, the wavelength conversion element 17 generates heat due to conversion loss upon wavelength conversion. Although the heat generated by the wavelength conversion element 17 transfers to the holding member 15 via the coupling part 15A, the low thermal conductivity of the holding member 15 makes it possible to suppress the heat conduction from the wavelength conversion element 17 to the semiconductor light emitting element 10 via the holding member 15.

Furthermore, by having the gap 15B between the wavelength conversion element 17 and the substrate 11 (the wavelength conversion element 17 is not in contact with the substrate 11), the holding member 15 (coupling part 15A) is the only heat conduction path from the wavelength conversion element 17 to the semiconductor light emitting element 10. This allows a large portion of the heat generated by the wavelength conversion element 17 as described above to dissipate in the air, making it possible to reduce an amount of the heat transferred to the holding member 15.

As described above, in this embodiment, the semiconductor light emitting element 10 that emits light along the direction substantially parallel to the main surface of the substrate 11 and the holding member 15 that holds the wavelength conversion element 17 are disposed on the substrate 11. In this manner, by holding the wavelength conversion element 17 using the frame-shaped semiconductor package including the semiconductor light emitting element 10 and the holding member 15 provided on a single substrate 11, size reduction of a part (low-profile configuration) or space saving can be achieved, compared with the Can-type semiconductor package. Thus, size reduction of the whole device can be achieved.

Next, embodiments other than the above-mentioned first embodiment and modification examples are described. Hereinbelow, same reference numerals indicate components similar to those in the first embodiment, and description thereof will be omitted as appropriate.

Second Embodiment

FIG. 7 illustrates a configuration of the semiconductor light emitting device according to a second embodiment of the disclosure (semiconductor light emitting device 1A) as seen from the top side (XY plane configuration). FIG. 8 illustrates a cross-sectional configuration taken along II-II line in FIG. 7 (XZ cross-sectional configuration), and FIG. 9 illustrates a configuration of a side surface (surface of the light emitting side) of the semiconductor light emitting device 1A. Similarly to the semiconductor light emitting device 1 of the above-mentioned first embodiment, the semiconductor light emitting device 1A is a lead-frame integrated semiconductor package.

Similarly to the semiconductor light emitting device 1 according to the above-mentioned first embodiment, the semiconductor light emitting device 1A includes, for example, the semiconductor light emitting element 10 on a substrate (substrate 11A). Disposed on the substrate 11 is, for example, the frame-like holding member 15 around the semiconductor light emitting element 10. The wavelength conversion element 17 is disposed on the light emitting side of the semiconductor light emitting element 10. The wavelength conversion element 17 is coupled to the edge of the opening of the holding member 15 (coupling part 15A).

Moreover, the semiconductor light emitting element 10 is covered by the sealing member 14 on the substrate 11A. Disposed between the substrate 11A and the semiconductor light emitting element 10 is, for example, the submount 12. The first electrode 13A and the second electrode 13B are patterned on the submount 12. The first electrode 13A and the second electrode 13B are electrically coupled to the first electrode 16A and the second electrode 16B via the wires 160 and 161, respectively.

However, in this embodiment, the wavelength conversion element 17 is coupled to the substrate 11A, unlike the above-mentioned first embodiment (the substrate 11A has on its end a coupling part 11C for the wavelength conversion element 17). The coupling part 11C has only to be in mechanical contact with the wavelength conversion element 17, and may be adhered thereto via adhesive, or may be engaged through mechanical fitting. The substrate 11A has a heat insulation structure 11B between a portion facing the semiconductor light emitting element 10 and a portion coupled to the wavelength conversion element 17.

An example of the heat insulation structure 11B is shown in FIGS. 10A and 10B. The heat insulation structure 11B includes, for example, a recess 11*b*1. In this example, a single recess 11b1 configures a groove extending along Y direction, for example. However, a plurality of recesses 11b1 may be provided, and the extending direction, the disposed position, and the like are not limited to this example. It suffices to have one or more regions where the thickness of the substrate 11A is locally small, as the recess(es) 11b1.

Otherwise, as illustrated in FIG. 11, the heat insulation structure 11B is not limited to have the recess 11b1 described above but may include an opening 11b2. In this example, a plurality of openings 11b2 are arranged along Y direction, for example. However, it is to be noted that there may be only one opening 11b2 and the number and the disposed positions thereof are not limited to this example. It suffices to have one or more regions penetrating the substrate 11A (through hole), as the opening(s) 11b2. There may also be provided both the recess 11b1 and the opening 11b2.

In this embodiment, heat dissipation members 21A, 21B are disposed on the back face side of the substrate 11A. The heat dissipation member 21A (first heat dissipation member) is coupled to the substrate 11A and is provided to face the semiconductor light emitting element 10 with the substrate 11A being provided therebetween. The heat dissipation member 21B (second heat dissipation member) is disposed to face the wavelength conversion element 17 with the substrate 11A being provided therebetween.

In this manner, in the semiconductor light emitting device 1A according to this embodiment, as with the semiconductor light emitting device 1 of the above-mentioned first embodiment, a predetermined voltage is applied to the cathode and the anode of the semiconductor light emitting element 10 via the first electrodes 16A and 13A and the second electrodes 16B and 13B to generate light emission. The light based on the light emission (e.g. blue light) is emitted from the end face of the semiconductor light emitting element 10 in the direction substantially parallel to the main surface of the substrate 11A and enters the wavelength conversion element 17. A portion of the blue light enters the wavelength conversion element 17 is converted into the light having a different wavelength (e.g., yellow light, or red light and green light). This alters the light outputted from the wavelength conversion element 17 to white light owing to color mixture of, for example, blue light and yellow light (or color mixture of blue light and red light and green light).

Moreover, compared with the Can-type semiconductor package, size reduction of a part or space saving can be achieved by disposing the semiconductor light emitting element 10 that emits light along the direction substantially parallel to the main surface of the substrate 11A and the frame-like holding member 15 that holds the wavelength conversion element 17 on the substrate 11A. It is thus possible to obtain the effect equivalent to that of the above-mentioned first embodiment.

In addition, in this embodiment, the substrate 11A is coupled to the wavelength conversion element 17 and has the heat insulation structure 11B as described above, a result of which it is difficult for the heat generated by the wavelength conversion element 17 to transfer to the semiconductor light emitting element 10. Moreover, providing the heat dissipation member 21B separately from the heat dissipation member 21A makes it possible to actively discharge heat from the wavelength conversion element 17, which then makes it possible to substantially eliminating heat conduction to the semiconductor light emitting element 10 side. Furthermore, with the phosphor used for the wavelength conversion element 17, although its performance is unlikely to be degraded by the heat, compared with the semiconductor light emitting element 10, it is possible to suppress degradation of both the semiconductor light emitting element 10 and the wavelength conversion element 17 by disposing the heat dissipation members 21A and 21B.

First Modification Example

FIG. 12 illustrates a configuration of the semiconductor light emitting device according to a first modification example as seen from the top side (XY plane configuration). FIG. 13 illustrates a cross-sectional configuration taken along line in FIG. 12 (XZ cross-sectional configuration). Although the heat dissipation members 21A and 21B are provided on the back face side of the substrate 11A in the above-mentioned second embodiment, the heat dissipation member 21B may not be provided. For example, in a case where the heat discharge by the heat dissipation member 21A is sufficient, or in a case where temperature increase in the wavelength conversion element 17 is not taken into consideration, there may be disposed the heat dissipation member 21A alone. Moreover, the substrate 11A may have the heat insulation structure 11B as illustrated, or the heat insulation structure 11B may not be provided.

Second Modification Example

FIG. 14 illustrates a cross-sectional configuration of the main part of the semiconductor light emitting device according to a second modification example (XZ cross-sectional configuration). This modification example has the same configuration as the semiconductor light emitting device 1 of the above-mentioned first embodiment except that a lens 22 is disposed between the semiconductor light emitting element 10 (particularly the sealing member 14) and the wavelength conversion element 17.

The lens 22 is an optical member that functions to collect the light emitted from the semiconductor light emitting element 10 (e.g., blue light Lb) toward the wavelength conversion element 17 (that has a function of beam forming of the blue light Lb).

As in this modification example, the lens 22 may be disposed between the semiconductor light emitting element 10 and the wavelength conversion element 17. In this case, it is possible to improve directionality of the blue light Lb emitted from the semiconductor light emitting element 10. Here, the light outputted from the wavelength conversion element 17 (e.g. white light Lw) is more divergent than the blue light Lb emitted from the semiconductor light emitting element 10, and the divergence angle is influenced by the directionality of the incident light. Disposing the lens 22 to improve the directionality of the blue light Lb emitted from the semiconductor light emitting element 10 as described in this modification example makes it possible to reduce the beam divergence angle of the white light Lw outputted from the wavelength conversion element 17.

Third Modification Example

FIG. 15 illustrates a cross-sectional configuration of the main part of the semiconductor light emitting device according to a third modification example (XZ cross-sectional configuration). This modification example has the same configuration as the semiconductor light emitting device 1 of the above-mentioned first embodiment except that a portion of a sealing member (sealing member 14A) formed to cover the semiconductor light emitting element 10 that faces the light emitting face of the semiconductor light emitting element 10 has a lens shape 14a1.

Similarly to the sealing member 14 of the above-mentioned first embodiment, the sealing member 14A is formed to cover the side surface and the top surface of the semiconductor light emitting element 10 and includes glass or resin having translucency. The lens shape 14a1 has a surface shape and has a function of collecting the light emitted from the semiconductor light emitting element 10 (e.g., blue light Lb) toward the wavelength conversion element 17.

As in this modification example, the sealing member 14A that covers the semiconductor light emitting element 10 may have the lens shape 14a1. In this case, similarly to the above-mentioned first modification example, it is possible to improve the directionality of the blue light Lb emitted from the semiconductor light emitting element 10 and to reduce the beam divergence angle of the white light Lw outputted from the wavelength conversion element 17. Moreover, the number of parts is smaller than that of the above-mentioned second modification example, which makes it possible to obtain the effect equivalent to that of the above-mentioned second modification example with a simpler configuration.

Fourth Modification Example

FIG. 16 illustrates a cross-sectional configuration of the main part of the semiconductor light emitting device according to a fourth modification example (XZ cross-sectional configuration). This modification example has the same configuration as the semiconductor light emitting device 1 of the above-mentioned first embodiment except that a wavelength conversion element (wavelength conversion element 17A) has a lens shape 17a1.

Similarly to the wavelength conversion element 17 of the above-mentioned first embodiment, the wavelength conversion element 17A is disposed to be held by the holding member 15, absorbs a portion of the light emitted from the semiconductor light emitting element 10, and outputs light having a wavelength different from that of the absorbed light. The wavelength conversion element 17A has a base material that carries, for example, phosphor (wavelength conversion material). One example is be a transparent base material including phosphor dispersed therein, a pair of substrates having a layer including phosphor sandwiched between them, or the like. One or both of the faces on the light incident side and the light emitting side of the based material used for the wavelength conversion element 17 (the face on the light emitting side in this case) have the lens shape 17a1. The lens shape 17a1 has a surface shape and has a function of collecting the light outputted from the wavelength conversion element 17A (e.g. white light Lw).

As in this modification example, the wavelength conversion element 17A may have the lens shape 17a1. In this case, with the wavelength conversion element 17A, it is possible to improve the directionality of the white light Lw outputted from the wavelength conversion element 17 and reduce its beam divergence angle while converting a wavelength of a portion of the blue light Lb emitted from the semiconductor light emitting element 10. Moreover, the number of parts is smaller than that of the above-mentioned second modification example, which makes it possible to obtain the effect equivalent to that of the above-mentioned second modification example with a simpler configuration.

Fifth Modification Example

FIG. 17 illustrates a configuration of the semiconductor light emitting device according to a fifth modification example as seen from the top side (XY plane configuration).

The above-mentioned embodiments and the like exemplify a configuration in which the holding member 15 is disposed around the semiconductor light emitting element 10 in a frame-like form, but the configuration of the holding member 15 is not limited thereto. For example, holding members 15D1 and 15D2 according to this modification example may be disposed only in selective regions on the substrate 11.

The holding members 15D1 and 15D2 can include the same material as the holding member 15 of the above-mentioned first embodiment. Moreover, the holding member 15D1 among these holds the wavelength conversion element 17 and has the coupling part 15A for the wavelength conversion element 17. The holding member 15D1 is, for example, disposed in a region corresponding to two corners on both ends of one short side of the rectangular substrate 11. In other words, the holding member 15D1 is disposed in the region corresponding to one short side of the rectangular substrate 11 and has the opening 150 facing the light emitting face of the semiconductor light emitting element 10. The holding member 15D2 is disposed in a region corresponding to the other short side of the substrate 11. The first electrode 16A and the second electrode 16B are fixed to and held by the holding member 15D2.

In this manner, the holding members 15D1 and 15D2 may not necessarily be disposed in the frame-like form. The holding members 15D1 and 15D2 have only to be configured to hold the wavelength conversion element 17 or the first electrode 16A and the second electrode 16B in predetermined positions, and the shapes, the positions, and the number thereof are not specifically limited.

Although description has been made by giving the embodiments and their modification examples as mentioned above, the contents of the disclosure are not limited to the above-mentioned example embodiments and may be modified in a variety of ways. For example, configurations of the semiconductor light emitting device described in the above-mentioned embodiments are merely examples and may further include other members. Moreover, materials and thicknesses of the layers are also merely examples and not limited to those mentioned above.

Furthermore, although the light emitting element that emits blue light is exemplified as the semiconductor light emitting element 10 in the above-mentioned embodiments, the semiconductor light emitting element of the disclosure may be applied to a light emitting element that emits light having a different wavelength. For example, the semiconductor light emitting element may be a semiconductor laser that emits ultraviolet light or the like. Moreover, a combination of the wavelength of the light (excitation light) emitted from the semiconductor light emitting element described above and the wavelength outputted from the wavelength conversion element is not limited to the descriptions above.

Furthermore, the effects described in the above-mentioned embodiments are merely examples. There may be other effects and additional effects may be included.

It is to be noted that the disclosure may have the following configurations.

(1)

A semiconductor light emitting device, including:
a substrate;
a semiconductor light emitting element that is disposed on the substrate and that emits light along a direction substantially parallel to a main surface of the substrate;
a wavelength conversion element that is disposed on light emitting side of the semiconductor light emitting element, that absorbs a portion of the light emitted from the semiconductor light emitting element, and that emits light having a wavelength different from that of the absorbed light; and a holding member that is disposed on the substrate and holds the wavelength conversion element.

(2)

The semiconductor light emitting device according to (1), in which the holding member is disposed in at least a portion of a region around the semiconductor light emitting element on the substrate.

(3)

The semiconductor light emitting device according to (2), in which the holding member is disposed to surround the semiconductor light emitting element and has an opening facing a light emitting face of the semiconductor light emitting element, and the wavelength conversion element is coupled to an edge of the opening of the holding member.

(4)

The semiconductor light emitting device according to any one of (1) to (3), in which the holding member includes a material having thermal conductivity lower than that of the substrate.

(5)

The semiconductor light emitting device according to (4), in which the substrate includes a metal, and the holding member includes a nonmetal.

(6)

The semiconductor light emitting device according to any one of (1) to (5), in which a gap is provided between the wavelength conversion element and the substrate.

(7)

The semiconductor light emitting device according to any one of (1) to (5), in which the wavelength conversion element is coupled to the substrate.

(8)

The semiconductor light emitting device according to (7), in which the substrate has one or a plurality of recesses between a portion facing the semiconductor light emitting element and a portion coupled to the wavelength conversion element.

(9)

The semiconductor light emitting device according to (7), in which the substrate has one or a plurality of openings between a portion facing the semiconductor light emitting element and a portion coupled to the wavelength conversion element.

(10)

The semiconductor light emitting device according to any one of (1) to (9), further including:

a first heat dissipation member coupled to the substrate and disposed to face the semiconductor light emitting element, with the substrate being provided therebetween.

(11)

The semiconductor light emitting device according to any one of (1) to (10), further including:

a second heat dissipation member disposed to face the wavelength conversion element.

(12)

The semiconductor light emitting device according to any one of (1) to (11), including:

a sealing member provided to cover the semiconductor light emitting element.

(13)

The semiconductor light emitting device according to any one of (1) to (12), further including:

a lens between the semiconductor light emitting element and the wavelength conversion element.

(14)

The semiconductor light emitting device according to any one of (1) to (13), further including:

a sealing member provided to cover the semiconductor light emitting element, in which a portion of the sealing member facing the light emitting face of the semiconductor light emitting element has a lens shape.

(15)

The semiconductor light emitting device according to any one of (1) to (14), in which the wavelength conversion element has a base material that carries a wavelength conversion material, and one or both of faces of a light incident side and a light emitting side of the base material have a lens shape.

(16)

The semiconductor light emitting device according to any one of (1) to (15), in which the semiconductor light emitting element is a semiconductor laser.

(17)

The semiconductor light emitting device according to any one of (1) to (16), in which radiation angles of light emitted from the semiconductor light emitting element are different in a direction parallel to the substrate and a direction perpendicular to the substrate.

(18)

The semiconductor light emitting device according to any one of (1) to (17), in which a surface shape of the substrate is rectangular, and the holding member is disposed along a periphery of the substrate.

(19)

The semiconductor light emitting device according to (18), further including:

a pair of electrodes with one end of each electrode being electrically coupled to the semiconductor light emitting element and another end of each electrode serving as a terminal used for external coupling, in which the pair of electrodes penetrates a portion of the holding member and projects to the outside toward a direction opposite to a light emitting direction of the semiconductor light emitting element.

(20)

The semiconductor light emitting device according to any one of (1) to (19), in which the semiconductor light emitting element emits blue light, and the wavelength conversion element includes phosphor that emits yellow light or phosphor that emits red light and green light, using the blue light as excitation light.

This application claims the benefit of Japanese Patent Application JP2016-14610 filed with the Japan Patent Office on Jan. 28, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor light emitting device, comprising:
a substrate;
a semiconductor light emitting element on a main surface of the substrate,
wherein the semiconductor light emitting element is configured to emit a first light along a direction substantially parallel to the main surface of the substrate;
a wavelength conversion element on a light emitting side of the semiconductor light emitting element,
wherein the wavelength conversion element is configured to:
absorb a portion of the first light emitted from the semiconductor light emitting element; and
emit a second light having a wavelength different from that of the absorbed portion of the first light;
a sealing member in contact with the semiconductor light emitting element, wherein
the sealing member is configured to cover the semiconductor light emitting element,
a portion of the sealing member that faces a light emitting face of the semiconductor light emitting element has a lens shape, and
the portion of the sealing member having the lens shape is configured to collect the first light emitted from the semiconductor light emitting element toward the wavelength conversion element;
a holding member on the main surface of the substrate, wherein the holding member is configured to hold the wavelength conversion element; and
a pair of electrodes coupled to the holding member.

2. The semiconductor light emitting device according to claim 1, wherein the holding member is in at least a portion of a region around the semiconductor light emitting element on the substrate.

3. The semiconductor light emitting device according to claim 2, wherein
the holding member surrounds the semiconductor light emitting element,
the holding member comprises an opening that faces the light emitting face of the semiconductor light emitting element, and
the wavelength conversion element is coupled to an edge of the opening of the holding member.

4. The semiconductor light emitting device according to claim 1, wherein
the holding member includes a first material, and
a thermal conductivity of the first material is lower than a thermal conductivity of a second material of the substrate.

5. The semiconductor light emitting device according to claim 4, wherein
the substrate includes a metal, and
the holding member includes a nonmetal.

6. The semiconductor light emitting device according to claim 1, wherein a gap is present between the wavelength conversion element and the substrate.

7. The semiconductor light emitting device according to claim 1, wherein the wavelength conversion element is coupled to the substrate.

8. The semiconductor light emitting device according to claim 7, wherein the substrate comprises at least one recess between a first portion of the substrate facing the semiconductor light emitting element and a second portion of the substrate coupled to the wavelength conversion element.

9. The semiconductor light emitting device according to claim 7, wherein the substrate further comprises at least one opening between a first portion of the substrate facing the semiconductor light emitting element and a second portion of the substrate coupled to the wavelength conversion element.

10. The semiconductor light emitting device according to claim 1, further comprising a first heat dissipation member coupled to the substrate, wherein
the first heat dissipating member faces the semiconductor light emitting element, and
the substrate is between the first heat dissipating member and the semiconductor light emitting element.

11. The semiconductor light emitting device according to claim 10, further comprising a second heat dissipation member that faces the wavelength conversion element.

12. The semiconductor light emitting device according to claim 1, further comprising a lens between the semiconductor light emitting element and the wavelength conversion element.

13. The semiconductor light emitting device according to claim 1, wherein
the wavelength conversion element includes a base material that comprises a wavelength conversion material, and
at least one of a face of a light incident side or a face of a light emitting side of the base material has the lens shape.

14. The semiconductor light emitting device according to claim 1, wherein the semiconductor light emitting element comprises a semiconductor laser.

15. The semiconductor light emitting device according to claim 1, wherein a first radiation angle of the first light emitted from the semiconductor light emitting element in the direction parallel to the substrate is different from a second radiation angle of the first light emitted from the semiconductor light emitting element in a direction perpendicular to the substrate.

16. The semiconductor light emitting device according to claim 1, wherein
a surface shape of the substrate is rectangular, and
the holding member is along a periphery of the substrate.

17. The semiconductor light emitting device according to claim 1, wherein
a first end of each electrode of the pair of electrodes is electrically coupled to the semiconductor light emitting element and a second end of each electrode of the pair of electrodes is configured to serve as a terminal for external coupling, and
the pair of electrodes penetrates a portion of the holding member and projects to outside toward a direction opposite to a light emitting direction of the semiconductor light emitting element.

18. The semiconductor light emitting device according to claim 1, wherein
the semiconductor light emitting element is further configured to emit blue light, and
the wavelength conversion element includes one of a first phosphor configured to emit a yellow light or a second phosphor configured to emit a red light and green light, based on the blue light as excitation light.

* * * * *